United States Patent
Tailliet (10) Patent No.: US 10,199,368 B2
(45) Date of Patent: Feb. 5, 2019

(54) STUCTURE FOR PROTECTING AN INTEGRATED CIRCUIT AGAINST ELECTROSTATIC DISCHARGES

(71) Applicant: STMicroelectronics (Rousset) SAS, Rousset (FR)

(72) Inventor: François Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 41 days.

(21) Appl. No.: 15/436,819

(22) Filed: Feb. 19, 2017

(65) Prior Publication Data
US 2018/0033878 A1    Feb. 1, 2018

(30) Foreign Application Priority Data
Jul. 26, 2016  (FR) ..................................... 16 57160

(51) Int. Cl.
| | |
|---|---|
| *H01L 27/02* | (2006.01) |
| *H01L 29/74* | (2006.01) |
| *H01L 29/866* | (2006.01) |
| *H02H 9/04* | (2006.01) |

(52) U.S. Cl.
CPC ...... *H01L 27/0262* (2013.01); *H01L 27/0248* (2013.01); *H01L 27/0255* (2013.01); *H01L 27/0259* (2013.01); *H01L 29/7408* (2013.01); *H01L 29/7412* (2013.01); *H01L 29/866* (2013.01); *H02H 9/046* (2013.01)

(58) Field of Classification Search
CPC ............. H01L 27/0255; H01L 27/0259; H01L 27/0248; H01L 27/0262; H02H 9/046
See application file for complete search history.

(56) References Cited

U.S. PATENT DOCUMENTS

| | | | |
|---|---|---|---|
| 5,485,024 A | * | 1/1996 | Reay .................... H01L 27/0262 257/154 |
| 5,548,135 A | | 8/1996 | Avery |
| 5,747,834 A | | 5/1998 | Chen et al. |
| 5,949,094 A | | 9/1999 | Amerasekera |
| 5,959,821 A | | 9/1999 | Voogel |
| 6,399,900 B1 | | 6/2002 | Brennan et al. |
| 6,674,622 B1 | | 1/2004 | Yu et al. |
| 6,690,069 B1 | | 2/2004 | Vashchenko et al. |
| 6,765,771 B2 | | 7/2004 | Ker et al. |
| 6,777,721 B1 | | 8/2004 | Huang et al. |
| 6,933,540 B2 | | 8/2005 | Liu et al. |

(Continued)

FOREIGN PATENT DOCUMENTS

EP          0490786 A1    6/1992

*Primary Examiner* — Fei Fei Yeung Lopez
(74) *Attorney, Agent, or Firm* — Slater Matsil, LLP (57) ABSTRACT

An integrated circuit includes at least one input-output pad and a terminal intended to be connected to a source of a reference potential and further including a protection structure including a thyristor forward-connected between the pad and the terminal. The thyristor includes a first resistor between its cathode gate and the terminal. At least one Zener diode is disposed between the thyristor and the pad. The anode of the Zener diode is connected to the cathode gate of the thyristor and the cathode of the Zener diode is connected to the pad via at least one second resistor. The junction of the Zener diode is different from the junctions of the PNPN structure of the thyristor.

21 Claims, 7 Drawing Sheets

(56) References Cited

U.S. PATENT DOCUMENTS

| | | |
|---|---|---|
| 7,023,029 B1 | 4/2006 | Vashchenko et al. |
| 7,859,804 B1 | 12/2010 | Gallerano et al. |
| 8,299,533 B2 | 10/2012 | Campi, Jr. et al. |
| 2005/0224882 A1 | 10/2005 | Chatty et al. |
| 2005/0275984 A1 | 12/2005 | Liu et al. |
| 2007/0131965 A1 | 6/2007 | Kim et al. |
| 2009/0278168 A1 | 11/2009 | Hwang et al. |
| 2016/0149021 A1 | 5/2016 | Schmenn et al. |

\* cited by examiner

STUCTURE FOR PROTECTING AN INTEGRATED CIRCUIT AGAINST ELECTROSTATIC DISCHARGES

CROSS-REFERENCE TO RELATED APPLICATIONS

This application claims the priority benefit of French patent application number 1657160, filed on Jul. 26, 2016, the content of which is hereby incorporated by reference in its entirety to the maximum extent allowable by law.

TECHNICAL FIELD

The present invention relates to the protection of integrated circuits against electrostatic discharges.

BACKGROUND

An integrated circuit comprises metal pads intended to provide connections to the outside. Some of the pads are capable of receiving power supply voltages. The other pads are capable of receiving and/or of supplying input-output signals. Power supply rails, coupled to the power supply pads, are generally provided at the periphery of the circuit to power its different components. Generally, an insulating layer covers the circuit, only leaving access to the metal pads.

Such a circuit generally receives and/or supplies signals at a low voltage level (for example, from 1 to 5 V) and at a low current intensity (for example, from 1 µA to 10 mA), and is likely to be damaged when overvoltages or overintensities occur between pads of the circuit.

It is thus provided to associate a protection structure with each pad. The protection structure should be able to rapidly drain off significant currents, capable of occurring when an electrostatic discharge occurs between two pads of the circuit.

U.S. Pat. No. 6,765,771 describes an example of a protection structure comprising a thyristor.

SUMMARY

Thus, an embodiment provides an integrated circuit protected against electrostatic discharges. The integrated circuit comprises at least one input-output pad and a terminal intended to be coupled to a source of a reference potential. The integrated circuit also comprises a protection structure comprising a thyristor that includes a first resistor between its cathode gate and the terminal and forward-connected between the pad and the terminal, as well as at least one Zener diode between the thyristor and the pad. The anode of the Zener diode is connected to the cathode gate of the thyristor and the cathode of the Zener diode is coupled to the pad via at least one second resistor. The junction of the Zener diode is different from the junctions of the PNPN structure of the thyristor.

According to an embodiment, the protection structure further comprises at least a third resistor between the anode gate of the thyristor and the pad.

According to an embodiment, the protection structure further comprises a diode, the anode of the diode being connected to the terminal and the cathode of the diode being connected to the pad.

According to an embodiment, the circuit comprises a doped substrate of a first conductivity type having a surface and the protection structure further comprises a first doped semiconductor region of a second conductivity type opposite to the first conductivity type and extending in the substrate from the surface, the first region comprising a first portion extending along a first direction and continued at each end by a second portion extending along a second direction perpendicular to the first direction, the thyristor comprising a first transistor and a second transistor, the first portion of the first region forming the base of the first transistor.

According to an embodiment, the circuit comprises a controller for the turning on of the first transistor before, after, or at the same time as the turning on of the second transistor.

According to an embodiment, the protection structure further comprises a second doped semiconductor region of the first conductivity type, more heavily doped than the substrate, extending in the first portion of the first region only down to part of the depth of the first portion of the first region, the second region forming the emitter of the first transistor.

According to an embodiment, the protection structure further comprises, in each second portion of the first region, a third doped semiconductor region of the first conductivity type, more heavily doped than the substrate, extending in the second portion of the first region only down to part of the depth of the second portion of the first region, the third region forming the anode of the Zener diode.

According to an embodiment, the protection structure further comprises, in each second portion of the first region, at least one fourth doped semiconductor region of the second conductivity type, extending from the surface, crossing the third semiconductor region, and coming into contact with the second portion of the first region, the fourth region forming the cathode of the Zener diode.

According to an embodiment, the protection structure further comprises a fifth doped semiconductor region of the second conductivity type, the fifth region being located in depth in the substrate, the first region partially covering the fifth region and being in contact with the fifth region.

According to an embodiment, the fifth region delimits at least one first area of the substrate covering the fifth region and forming the base of the second transistor.

According to an embodiment, the fifth region forms an electric resistor coupled to the cathode of each Zener diode.

According to an embodiment, the fifth region forms a shunt coupled to the base of the first transistor.

According to an embodiment, the fifth region at least partly forms the cathode or the anode of the diode.

According to an embodiment, the protection structure further comprises two sixths doped semiconductor regions of the second conductivity type, extending in the substrate from the surface and coming into contact with the fifth region, the two sixth regions being located on either side of the first portion of the first region, each sixth region being separated from the second portions of the first region by a second area of the substrate, the sixth regions forming the cathode of the diode.

According to an embodiment, the second areas of the substrate form a shunt coupled to the base of the second transistor.

According to an embodiment, the protection structure further comprises two seventh doped semiconductor regions of the second conductivity type, extending in the substrate from the surface and which do not come into contact with the fifth region nor into contact with the second portions of the first region, the two seventh regions being located on either side of the first portion of the first region, each seventh region being interposed between the first portion of the first region and one of the sixth regions, the seventh regions forming the emitter of the second transistor.

The foregoing and other features and advantages will be discussed in detail in the following non-limiting description of specific embodiments in connection with the accompanying drawings.

DETAILED DESCRIPTION OF ILLUSTRATIVE EMBODIMENTS

The same elements have been designated with the same reference numerals in the different drawings and, further, the various drawings are not to scale. For clarity, only those elements which are useful to the understanding of the described embodiments have been shown and detailed. In the following description, when reference is made to terms qualifying the relative position, such as terms "top", "upper", etc., or terms qualifying direction such as terms "horizontal", "vertical", etc., reference is made to the orientation of the drawings or to an integrated circuit in a normal position of use. Unless otherwise specified, expressions "approximately", "substantially", and "in the order of" mean to within 10%, preferably to within 5%.

Further, in the present description, term "connected" is used to designate a direct electric connection, with no intermediate electronic component, for example, by means of a conductive track, and term "coupled" or term "linked" will be used to designate either a direct electric connection (then meaning "connected") or a connection via one or a plurality of intermediate components (resistor, capacitor, etc.).

According to an embodiment, each power supply or input/output pad of an integrated circuit is provided with a structure of protection against electrostatic discharges coupling the pad to a ground terminal. Term ground designates, here and in the following description, a reference potential common to various components of the integrated circuit, for example, a low power supply potential. The connections to ground of the integrated circuit may be formed via a ground rail, or low power supply rail, the rail being coupled to a pad, accessible outside of the circuit and capable of being set to the selected reference potential.

According to an embodiment, the protection structure comprises a thyristor for the draining off, in case of a positive electrostatic discharge, of a significant current from the pad to the ground terminal. According to an embodiment, the shunts coupled to the bases of the bipolar transistors forming the thyristor are formed independently from each other and their values may be adjusted according to the desired operation of the protection structure. The thyristor gate control circuit comprises at least one Zener diode. The shunts of the bases of the bipolar transistors forming the thyristor are preferably formed by doped semiconductor regions of a semiconductor substrate. This advantageously enables to decrease the surface area occupied by the protection structure. A compact protection structure can thus be obtained. According to an embodiment, the protection structure further comprises a diode for the draining off, in case of a negative electrostatic discharge, of a significant current between the pad and the ground terminal.

Figure 1:
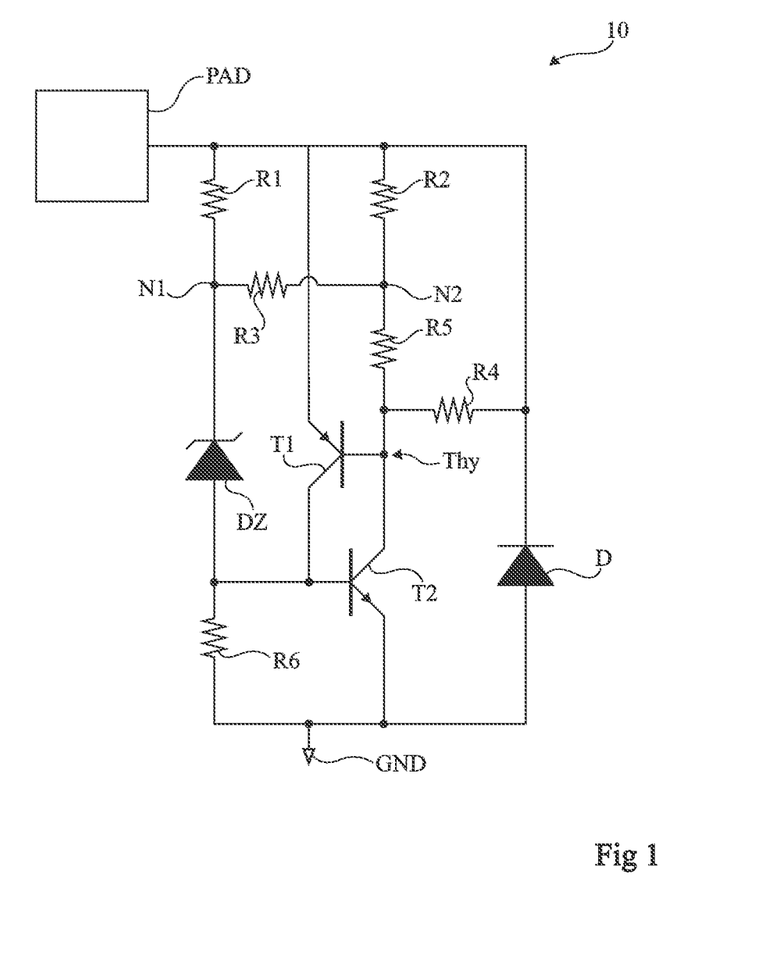
FIG. 1 is an electric diagram of an embodiment of a structure of protection of an integrated circuit against electrostatic discharges.

FIG. 1 shows an equivalent electric diagram of an embodiment of a structure 10 of protection against electrostatic discharges. FIG. 1 shows an input-output pad PAD of an integrated circuit. Input-output pad PAD is coupled to protection structure 10 connected between pad PAD and a ground terminal GND of the circuit.

Protection structure 10 comprises a thyristor Thy, forward-connected between input-output pad PAD and ground GND. In FIG. 1, thyristor Thy is represented by a PNP-type bipolar transistor T1 and an NPN-type bipolar transistor T2, the base of bipolar transistor T1 being coupled to the collector of bipolar transistor T2 and the base of bipolar transistor T2, which corresponds to the cathode gate of the thyristor, being coupled to the collector of bipolar transistor T1. The emitter of PNP bipolar transistor T1 is connected to pad PAD and the emitter of NPN bipolar transistor T2 is connected to ground GND.

Protection structure 10 further comprises:
a resistor R1 coupling, preferably connecting, pad PAD to a node N1;
a resistor R2 coupling, preferably connecting, pad PAD to a node N2;
a resistor R3 coupling, preferably connecting, node N1 to node N2;
a Zener diode DZ or Zener diodes DZ assembled in parallel (a single Zener diode being shown in FIG. 1), the anode of each Zener diode being coupled, preferably connected, to the base of NPN bipolar transistor T2 and the cathode of each Zener diode being coupled, preferably connected, to node N1;
a resistor R4 coupling, preferably connecting, the base of PNP bipolar transistor T1 to pad PAD;
a resistor R5 coupling, preferably connecting, the base of PNP bipolar transistor T1 to node N2;
a diode D having its anode coupled, preferably connected, to ground GND and having its cathode coupled, preferably connected, to pad PAD; and
a resistor R6 coupling, preferably connecting, the anodes of each Zener diode DZ to ground GND.

FIGS. 2 to 6 illustrate an integrated embodiment of protection structure 10 shown in FIG. 1.

Protection structure 10 comprises doped regions formed in a doped semiconductor substrate 12, for example, made of single-crystal silicon, of a first conductivity type, for example, P-type doped, and comprising an upper surface 14 supporting a stack of insulating layers 16 having electrically-conductive tracks of different metallization levels, electrically-conductive contacts, and electrically-conductive vias, formed inside and on top of them.

Protection structure 10 comprises a plurality of doped semiconductor regions formed in substrate 12. According to an embodiment, the regions are arranged substantially symmetrically with respect to two perpendicular planes of symmetry P1 and P2. In the following description, call D1 a direction perpendicular to plane P1 and call D2 a direction perpendicular to plane P2.

Figure 2:
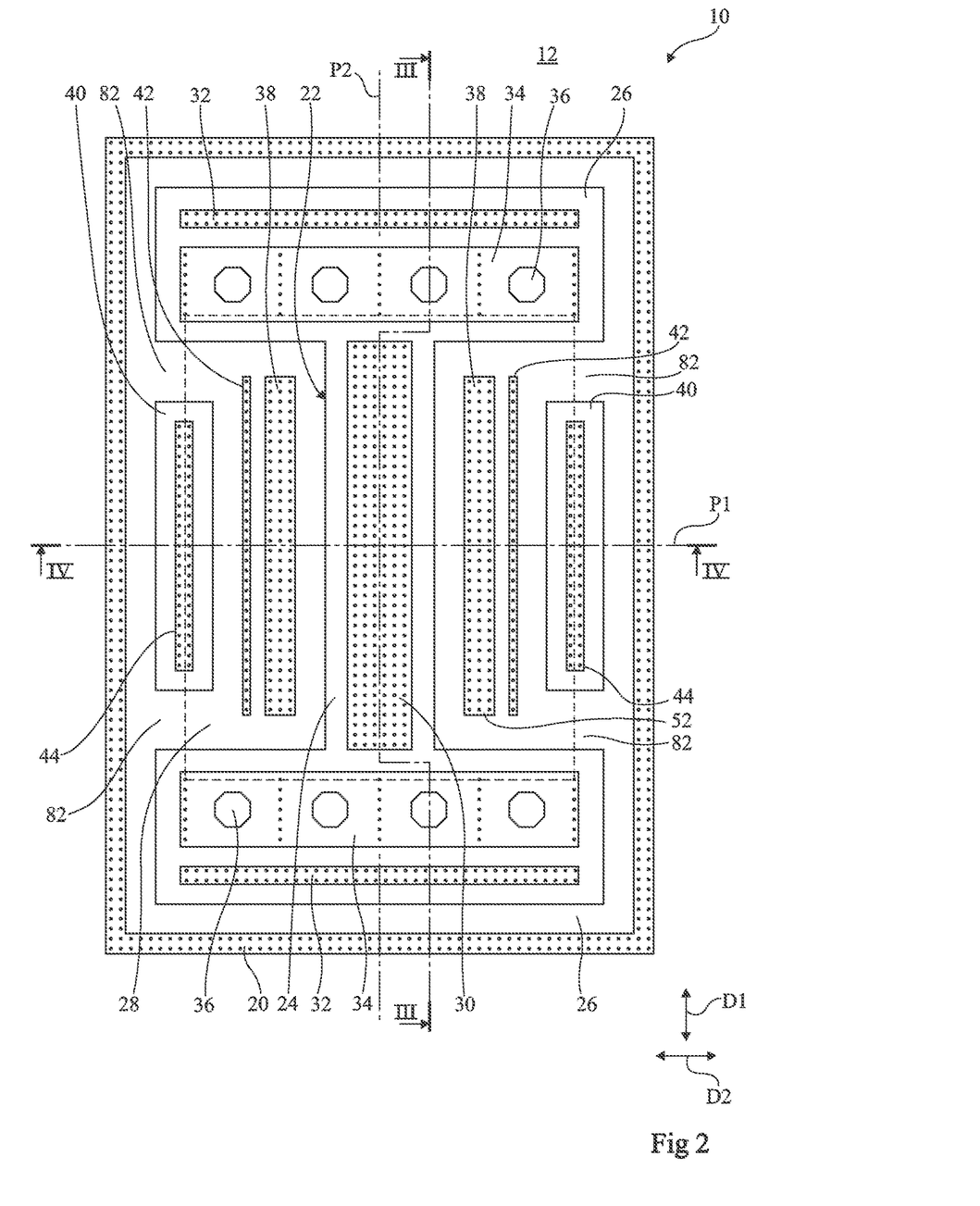
FIG. 2 is a partial simplified top view of doped regions of a semiconductor substrate of the protection structure of FIG. 1 and of the contacts coupling these doped regions to metal tracks of the first metallization level.
Figure 3:
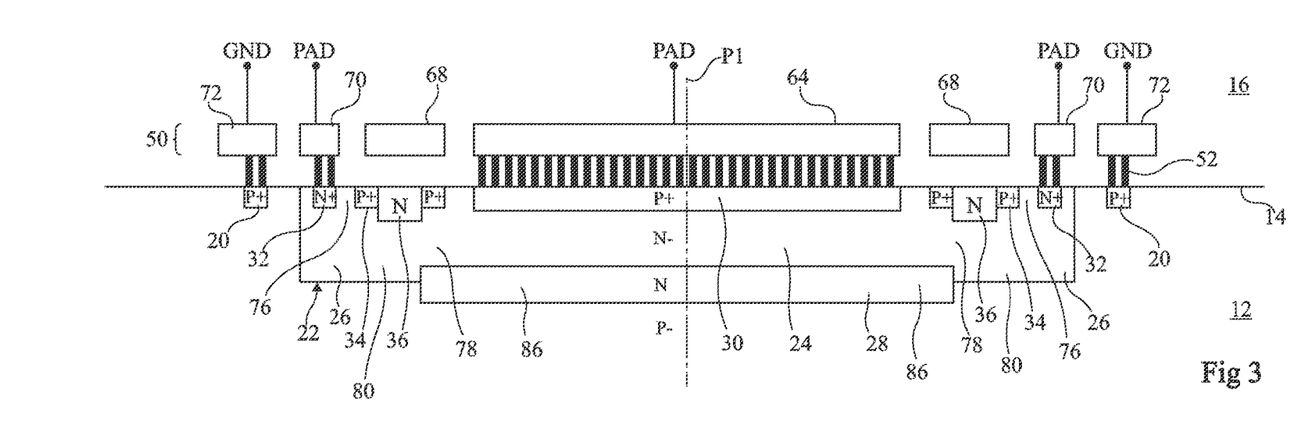
FIGS. 3 and 4 are partial simplified cross-section views of FIG. 2 respectively along lines III-III and IV-IV.
Figure 4:
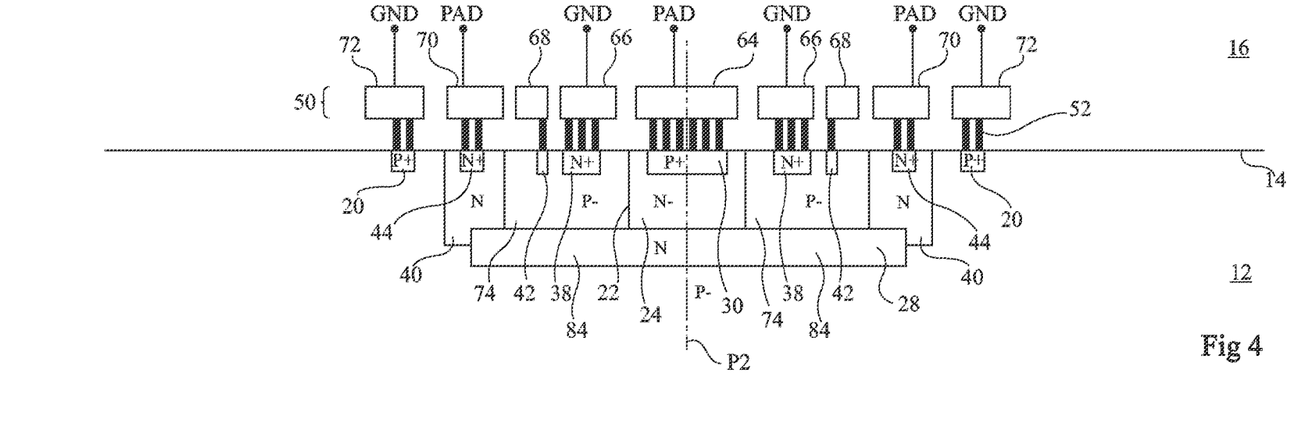

FIG. 2 is a top view of surface 14 of substrate 12 and FIGS. 3 and 4 are cross-section views of FIG. 2 respectively along lines III-III and IV-IV.

As appears in the drawings, protection structure 10 comprises:

a P-type doped region 20, more heavily-doped (P+) than substrate 12 (P−), extending in substrate 12 from surface 14 and forming in top view a ring, for example, of rectangular shape, delimiting a portion of surface 14;

a lightly-doped N-type region 22 (N−) extending in substrate 12 from surface 14 into ring-shaped region 20 and for example having a "H" shape in top view, planes P1 and P2 each being a plane of symmetry for region 22, region 22 comprising a central portion 24, having in top view a shape, for example rectangular, having its major axis parallel to direction D1, planes P1 and P2 each being a plane of symmetry for central portion 24, central portion 24 being continued at its ends by two lateral portions 26, each having in top view a shape, for example rectangular, having its major axis parallel to direction D2, lateral portions 26 being arranged symmetrically to each other with respect to plane P1, plane P2 being a plane of symmetry for each lateral portion 26;

an N-type doped region 28, having its lateral edge shown in dotted lines in FIG. 2, more heavily-doped than region 22 and formed in depth in substrate 12, in contact with the bottom of region 22 and having in top view a shape, for example, rectangular, having its major axis parallel to direction D1, planes P1 and P2 each being a plane of symmetry for region 28;

a P-type doped region 30, more heavily doped (P+) than substrate 12, extending in substrate 12 from surface 14 into ring-shaped region 20 and for example having a rectangular shape in top view, planes P1 and P2 each being a plane of symmetry for region 30, the major axis of region 30 being substantially parallel to direction D1;

two heavily-doped N-type regions 32 (N+), each extending in one of lateral portions 26 of region 22 and each having, for example, in top view, the shape of a rectilinear strip, the two regions 32 extending parallel to each other and being arranged symmetrically to each other with respect to plane P1, plane P2 being a plane of symmetry for each region 32, the major axis of each region 32 being substantially parallel to direction D2;

two heavily-doped P-type regions 34 (P+), each extending in one of lateral portions 26 of region 22 and each having, for example, in top view, the shape of a rectangle, the two regions 34 extending parallel to each other and being arranged symmetrically to each other with respect to plane P1, plane P2 being a plane of symmetry for each region 34, the major axis of each region 34 being substantially parallel to direction D2, each region 34 being interposed between one of strips 32 and region 30;

N-type doped regions 36, more heavily doped (N+) than region 22 and forming separate islands, extending in substrate 12 from surface 14 into regions 34, down to a depth greater than the depth of region 34, so that the bottom of each region 36 is in electric contact with one of lateral portions 24 of region 22, each region 36 having in top view, for example, the shape of a disk or of a polygon, in particular of an octagon, regions 36 being arranged symmetrically with respect to planes P1 and P2, eight regions 36 being shown as an example in FIG. 2, four regions 36 being located in one of regions 34 and four regions 36 being located in the other region 34;

two N-type doped regions 38 extending in substrate 12 from surface 14 into ring-shaped region 20 and each for example having in top view the shape of a rectilinear strip, the two regions 38 extending parallel to each other and being arranged symmetrically to each other with respect to plane P2, plane P1 being a plane of symmetry for each region 38, the major axis of each region 38 being substantially parallel to direction D1, regions 38 being located on either side of central portion 24 of region 22;

two N-type doped regions 40 extending in substrate 12 to reach buried region 28 from surface 14 into ring-shaped region 20 and each for example having in top view the shape of a rectangle, the two regions 40 extending parallel to each other and being arranged symmetrically to each other with respect to plane P2, plane P1 being a plane of symmetry for each region 40, the major axis of each region 40 being substantially parallel to direction D1, regions 40 being located on either side of central portion 24 of region 22, each region 38 being located between one of regions 40 and central portion 24 of region 22, where the N-type doped regions are not in contact with lateral portions 26 of N-type doped region 22;

two P-type doped regions 42, more heavily doped (P+) than substrate 12, extending in substrate 12 from surface 14 into ring-shaped region 20 and each for example having in top view the shape of a rectilinear strip, the two regions 42 extending parallel to each other and being arranged symmetrically to each other with respect to plane P2, plane P1 being a plane of symmetry for each region 42, the major axis of each region 42 being substantially parallel to direction D1, regions 42 being located on either side of central portion 24 of region 22, each region 42 being located between one of regions 40 and one of regions 38; and two N-type regions 44, more heavily doped (N+) than region 40, each region 44 extending in one of regions 40, the two regions 44 extending parallel to each other and being arranged symmetrically to each other with respect to plane P2, plane P1 being a plane of symmetry for each region 44, the major axis of each region 44 being substantially parallel to direction D1.

Protection structure 10 further comprises regions of an electrically-insulating material, not shown in FIGS. 3 and 4, formed at the surface of substrate 12 and laterally separating heavily-doped N- and P-type regions 20, 30, 32, 34, 38, 44, 42. These regions made of an electrically-insulating material, which for example correspond to electric insulation trenches of STI type (Shallow Trench Isolation), extend in relief from surface 14 and in depth from surface 14 in substrate 12 and in N-type doped regions 22 and 40 between heavily-doped N- and P-type regions 20, 30, 32, 34, 38, 44, 42.

Figure 5:
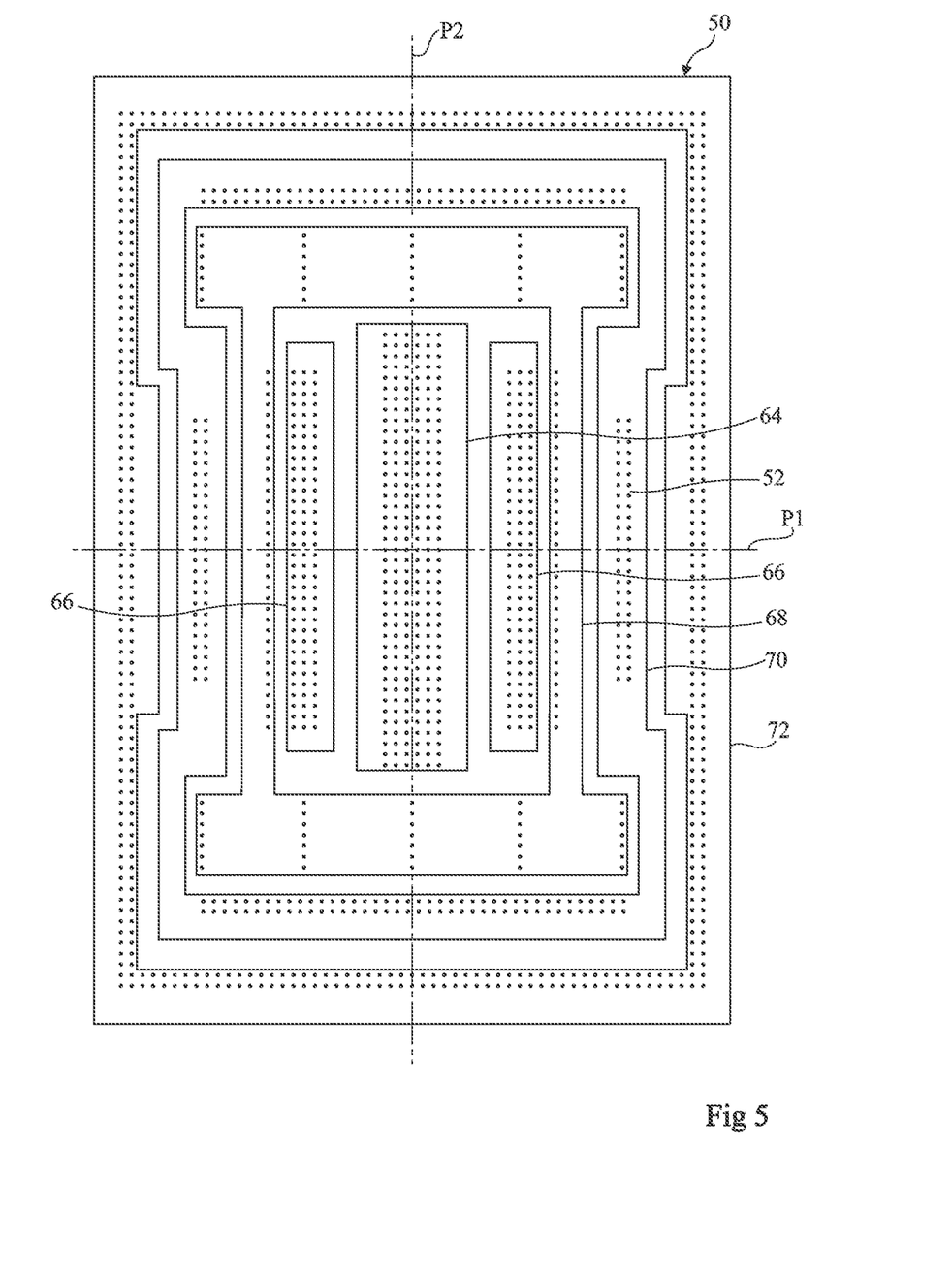
FIG. 5 is a partial simplified top view of the metal tracks of the first metallization level of the protection structure of FIG. 1 and of the contacts coupling these tracks to the doped regions of the substrate.

FIG. 5 is a top view showing conductive tracks 50 of the first metallization level of protections structure 10. FIGS. 2 and 5 further represent with black squares electrically-conductive contacts 52 which form the electric connection between the doped regions of protection structure 10 formed in substrate 12 and conductive tracks 50 of the first metallization level. Conductive tracks 50 of the first metallization level and contacts 52 are also shown in FIGS. 3 and 4.

Figure 6:
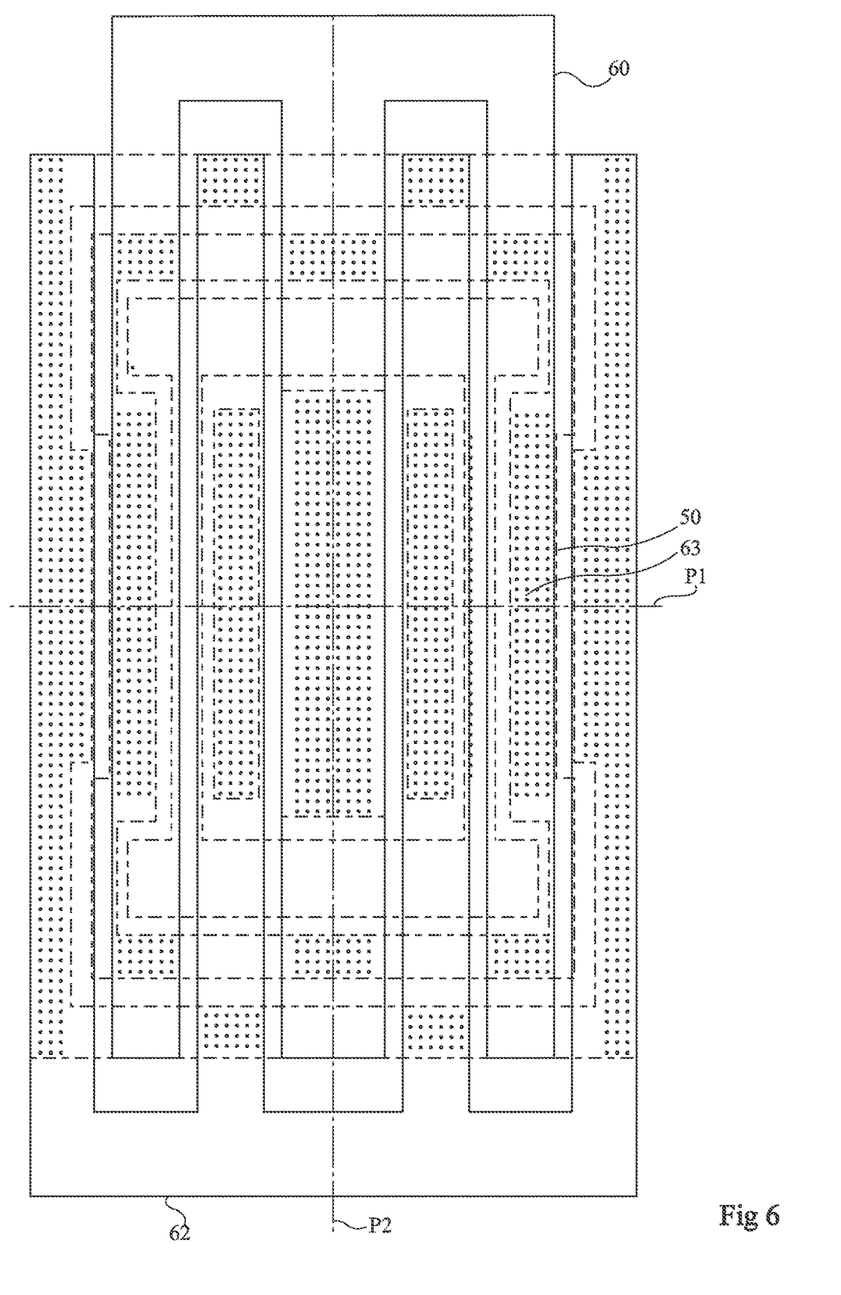
FIG. 6 is a partial simplified top view of the metal tracks of the first and second metallization levels of the protection structure of FIG. 1 and of the conductive vias coupling the metal tracks of the first metallization level to the metal tracks of the second metallization level.

FIG. 6 is a top view showing in full lines two electrically-conductive tracks 60, 62 of protection structure 10 of the second metallization level and in stripe-dot lines the conductive tracks 50 of the first metallization level. Conductive track 60 is connected to pad PAD and conductive track 62 is connected to ground GND. Conductive track 60 has the general shape of a comb with three teeth and conductive track 62 has the general shape of a comb with four teeth, the three teeth of conductive track 60 being interposed between the four teeth of conductive track 62. FIG. 6 further represents with black squares electrically-conductive vias 63 which form the electric connection between conductive tracks 50 of the first metallization level and conductive tracks 60, 62 of the second metallization level.

Conductive tracks 50 of the first metallization level are arranged substantially symmetrically with respect to planes of symmetry P1 and P2. Conductive tracks 50 comprise:

a central conductive track 64 coupled to region 30 and to conductive track 60;

two conductive tracks 66 coupled to regions 38 and coupled to conductive track 62;

a ring-shaped conductive track 68 surrounding conductive tracks 64 and 66, and coupled to regions 42 and 34;

a ring-shaped conductive track 70 surrounding conductive track 68, coupled to regions 32 and 40 and coupled to conductive track 60; and a ring-shaped conductive track 72 surrounding conductive track 70, coupled to region 20 and coupled to conductive track 62.

Lightly-doped P-type substrate 12 may correspond to a layer formed by epitaxy on a support and having a thickness from 4 μm to 8 μm. It particularly takes part in the operation of diode D which is forward-biased during negative electrostatic discharges. The P-type dopant concentration of substrate 12 typically is in the range from $10^{15}$ atoms/cm$^3$ to $10^{17}$ atoms/cm$^3$.

N-type regions 22 and 40 may be a region formed by using CMOS transistor manufacturing technologies and may correspond to the N-type doped wells used during the forming of CMOS transistors. Portion 24 of region 22 forms the base of PNP transistor T1 of thyristor Thy. Regions 22 and 40 partly delimit areas 74 partially insulated from substrate 12 and form the well having the Zener diodes formed therein. Regions 22 and 40 may extend down to a depth in the range from 1 m to 2 μm, for example, approximately 1.5 m. The N-type dopant concentration of regions 22 and 40 typically is in the range from $10^{16}$ atoms/cm$^3$ to $10^{17}$ atoms/cm$^3$. The maximum length measured along direction D1 of region 22 may be in the range from 10 μm to 100 μm, for example, approximately 15 μm. The maximum length measured along direction D2 of lateral portions 26 of region 22 may be in the range from 10 μm to 100 μm, for example, 13 μm. The length measured along direction D1 of region 40 may be in the range from 1 m to 50 μm, for example, approximately 10 m. The width measured along direction D2 of region 40 may be in the range from 1 m to 5 μm, for example, approximately 2 μm. Advantageously, N-type regions 22 and 40 are formed by implantation of dopants with the same dose and the same energy. The implantation conditions may be the same as those implemented for the N-type well manufacturing used on forming of P-channel transistors.

N-type buried region 28 enables to delimit, with regions 22 and 40, areas 74 partially insulated from substrate 12. It is in electric contact with region 22. Region 28 may be formed at an average depth in the order of 1.5 μm and may have a thickness in the order of 0.5 m. The N-type dopant concentration of buried region 28 is typically in the order of $10^{17}$ atoms/cm$^3$. The length measured along direction D1 of region 28 may be in the range from 10 μm to 100 μm, for example, approximately 15 μm. The length measured along direction D2 of region 28 may be in the range from 10 μm to 50 μm, for example, approximately 13 μm.

Heavily-doped N-type regions 32, 38, 44 may be formed by implantation by using N-channel MOS transistor drain and source manufacturing technologies. Regions 38 form the emitter of NPN transistor T$_2$ of thyristor Thy and regions 32 and 44 form contacts for N-type regions 22 and 40. Regions 32, 38, 44 may extend down to a depth in the range from 0.2 m to 0.4 μm, for example, approximately 0.3 μm. The N-type dopant concentration of regions 32, 38, 44 typically is in the range from $10^{19}$ atoms/cm$^3$ to $10^{20}$ atoms/cm$^3$.

The length measured along direction D1 of region 38 is in the order of the length measured along direction D1 of portion 24 of region 22 and may be in the range from 10 m to 100 μm. The length measured along direction D2 of region 38 may be in the range from 0.5 μm to 5 μm, for example, approximately 1 μm. The length measured along direction D1 of region 44 is slightly smaller than the length measured along direction D1 of region 38 and may be in the range from 5 μm to 100 μm, for example, approximately 7.6 μm. The length measured along direction D2 of region 44 may be in the range from 0.1 μm to 1 μm, for example, approximately 0.4 μm. The length measured along direction D2 of region 32 is slightly smaller than the length measured along direction D2 of portion 26 of region 22 and may be in the range from 10 m to 100 μm, for example, approximately 13 μm. The length measured along direction D1 of region 32 may be in the range from 0.1 μm to 1 μm.

Heavily-doped P-type regions 20, 30, 34, 42 may be formed by implantation by using P-channel MOS transistor drain and source manufacturing technologies. Region 30 forms the emitter of PNP transistor T1 of thyristor Thy. Regions 42 form a contact for the base of NPN transistor T2 of thyristor Thy. Regions 34 form the anode of Zener diodes DZ. Regions 20 form anode contacts for diode D. Regions 20, 30, 34, 42 may extend down to a depth in the range from 0.2 m to 0.4 μm, for example, approximately 0.3 μm. The P-type dopant concentration of regions 20, 30, 34, 42 typically is in the range from $10^{19}$ atoms/cm$^3$ to $10^{20}$ atoms/cm$^3$.

The length measured along direction D1 of region 30 is in the order of the length measured along direction D1 of region 38 and may be in the range from 10 μm to 100 μm. The length measured along direction D2 of region 30 may be in the range from 0.1 μm to 1 μm. The length measured along direction D2 of region 34 is in the order of the length measured along direction D2 of region 32 and may be in the range from 10 μm to 100 μm. The length measured along direction D1 of region 34 may be in the range from 1 μm to 10 μm, for example, approximately 2.5 μm. The length measured along direction D1 of region 42 is in the order of the length measured along direction D1 of region 38 and may be in the range from 10 μm to 50 μm. The length measured along direction D2 of region 42 may be in the range from 0.1 μm to 1 μm. Advantageously, heavily-doped P-type regions 20, 30, 34, 42 are formed by implantation of dopants with the same dose and the same energy. The implantation conditions may be the same as those implemented for the manufacturing of the drains and of the sources of P-channel MOS transistors.

Heavily-doped N- and P-type regions 20, 30, 32, 34, 38, 44, 42 further form contact recovery regions and are electrically coupled by contacts 52 to metal tracks 64, 66, 68, 70, 72 of the first metallization level.

N-type doped regions 36 have a dopant concentration which may be different from those of heavily-doped N-type regions 32, 38, 44. They may be formed by dopant implantation down to a depth greater than that of P-type doped regions 34 to be in electric contact with N-type doped region 22. Regions 36 are thus in electric continuity with N-type doped regions 26. N-type doped regions 36 are in contact with P-type doped regions 34 to form the junctions of the Zener diodes. The dopant concentration of regions 36 determines the avalanche voltage of the Zener diodes, for example, between 5 V and 5.5 V. Regions 36 may extend down to a depth in the order of 0.5 µm. The N-type dopant concentration of regions 36 is typically in the order of $10^{18}$ atoms/cm$^3$. The diameter of the circle containing in top view the cross-section of each region 36 is in the range from 1 µm to 2 µm, for example, approximately 1.4 µm.

The emitter of PNP transistor T1 is formed by heavily-doped P-type region 30. It is directly connected to pad PAD. Central portion 24 of N-type doped region 22 forms the base of PNP transistor T1 and the collector of NPN transistor T2. It further forms the anode gate of thyristor Thy. Areas 74 of substrate 12 form the collector of PNP transistor T1 and form the base of NPN transistor T2. They further form the cathode gate of thyristor Thy. The potential of areas 74 of substrate 12 is controlled by heavily-doped P-type region 42. The emitter of NPN transistor T2 is formed by heavily-doped N-type region 38.

The cathode of diode D is formed by N-type doped regions 40 and lateral portions 26 of N-type doped region 22 with heavily-doped N-type regions 32 and 44 forming the electric contacts. Buried region 28 also takes part in the forming of the cathode of diode D. The anode of diode D is formed by the portion of substrate 12 close to heavily-doped P-type region 20, which further plays the role of a guard ring.

The anode of the Zener diodes is formed by P-type doped region 34. The cathode of the Zener diodes is formed by each N-type doped region 36. Each region 36 is sufficiently deep to cross regions 34 in depth to obtain an electric continuity with lateral portions 26 underlying N-type doped region 22. The cathode contact is formed by heavily-doped N-type regions 32. Portions 76, shown in FIG. 3, of the lateral portions 26 which extend between regions 36 and the adjacent regions 32 form a series resistor providing access from pad PAD to the cathode of Zener diodes DZ. Portions 76 substantially correspond to resistor R1 in FIG. 1. Portions 78, shown in FIG. 3, of the lateral portions 26 which extend between each region 36 and buried region 28 form a series resistor of access of each Zener diode DZ to buried region 28. Portions 78 substantially correspond to resistor R3 in FIG. 1. Portions 80 of lateral portions 26 which extend under regions 34 also form a series resistor providing access to pad PAD. Portions 80 substantially correspond to resistor R2 in FIG. 1. Portions 76, 78, and 80 form a resistive bridge illustrating the access resistors in lateral portions 26 of region 22 in the vicinity of each Zener diode. The characteristics of the Zener diode may advantageously be adjusted independently from those of thyristor Thy.

Protection structure 10 comprises a shunt at the base of NPN transistor T2 formed by resistor R6 between each area 74 of substrate 12 and ground GND. This is achieved by locally interrupting the N-type walls which laterally surround areas 74 of substrate 12 to obtain an electric path between each area 74 and the rest of substrate 12. According to an embodiment, areas 82 of substrate 12, shown in FIG. 2, coupling each area 74 to the rest of substrate 12 are provided. Areas 82 extend between N-type doped regions 40 and lateral portions 26 of N-type doped region 22. The value of resistor R6 is dictated by the shape of areas 82, in particular by the ratio of the length of areas 82 measured along direction D2, which is substantially equal to the width measured along direction D2 of areas 40, to the length of areas 82 measured along direction D1, which is substantially equal to the distance measured along direction D1 separating regions 40 and portions 26 of region 22.

Protection structure 10 comprises a shunt at the base of PNP transistor T1 formed by a plurality of resistive paths corresponding to resistors R1, R2, R3, R4, and R5 between the base of PNP transistor T1 and pad PAD in FIG. 1. A first path is essentially formed by portions 84, shown in FIG. 4, of buried region 28 which couple N-type doped semiconductor region 24 and N-type doped semiconductor region 40. Portions 84 substantially correspond to resistor R4.

A second resistive path is formed, on the one hand, by portions 86, shown in FIG. 3, of buried region 28 which connect central portion 24 of N-type doped semiconductor region 22 and lateral portions 26 of semiconductor region 22 and, on the other hand, by portions 78 and 80 of lateral portions 26 of N-type doped region 22. Portions 86 substantially correspond to resistor R5. Portions 84 and 86 extend substantially along perpendicular directions. The shunt at the base of PNP transistor T1 is thus formed by resistive paths having three-dimensional structures. The values of resistors R1, R2, R3, R4, R5, and R6 may each be in the order of a few hundreds of ohms.

FIGS. 7A, 7B, 8A, 8B, 9A, 9B, 10A, 10B, 11A, 11B, 12A, and 12B illustrate the operation of protection structure o0. The current-vs.-voltage characteristics of FIGS. 7B, 8B, 9B, 10B, 11B, and 12B have been obtained by real electric measurements. Each division on the axis of abscissas corresponds to 2 V and each division on the axis of ordinates corresponds to 10 mA.

Diode D provides a low-voltage path to ground GND during negative electrostatic discharges. Thyristor Thy provides a low-voltage path to ground GND during positive electrostatic discharges. The function of the Zener diodes is to control the turning on of thyristor Thy. The function of the shunt at the base of NPN transistor T2 is to determine the cathode gate turn-on current of thyristor Thy and to determine the hold voltage of thyristor Thy. The function of the shunt at the base of PNP transistor T1 is to determine the anode gate turn-on current of thyristor Thy and to determine the hold voltage of thyristor Thy. The shunts at the base of NPN transistor T2 and at the base of PNP transistor T1 determine the intensity of the current flowing through Zener diodes DZ at the turn-on point of thyristor Thy. The relative values of the shunts at the base of NPN transistor T2 and at the base of PNP transistor T1 determine which of the two transistors T1 and T2 turns on first in steady state. According to an embodiment, the turn-on levels of transistors T1 and T2 are close. This enables to reach a maximum turn-on speed of thyristor Thy by making the base-emitter junctions of transistors T1 and T2 substantially simultaneously conductive. This provides a faster turning on of thyristor Thy than with a conventional thyristor turned on by a single gate. Indeed, conventionally, the turning on of a thyristor is achieved by turning on NPN transistor T2 and then by turning on PNP transistor T1.

The time period necessary to turn on thyristor Thy is then equal to the sum of time period ΔT1 necessary to turn on NPN transistor T2 and of time period ΔT2 necessary to turn on PNP transistor T1. When the turn-on levels of transistors T1 and T2 are close, the time period necessary to make thyristor Thy conductive is then only equal to the maximum time period among time periods ΔT1 and ΔT2. The decrease of the time period necessary to turn on thyristor Thy advantageously enables to improve the protection provided by protection structure 10, particularly for the protection of the drains of N-channel MOS transistors. When transistor Thy is on, the conduction current is self-sustained. The on-state series resistance of protection structure 10 is low, for example, in the order of 1 ohm and the voltage drop across protection structure 10 may be in the order of 1 V.

Figure 7A:
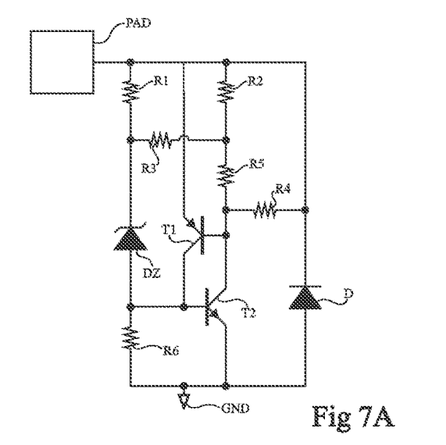
FIGS. 7A, 8A, 9A, 10A, 11A, and 12A each show the electric diagram of the protection structure of FIG. 1 indicating the path followed by the current at different operating phases of the protection structure of FIG. 1.
Figure 7B:
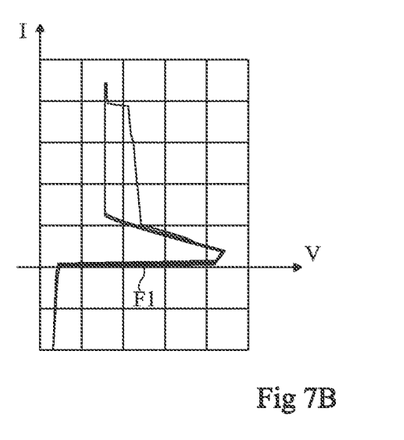
FIGS. 7B, 8B, 9B, 10B, 11B, and 12B each show the current-to-voltage characteristic of the protection structure of FIG. 1, highlighting the portion of the characteristic where the operating point of the protection structure at different operating phases is located.

FIGS. 7A and 7B illustrate the case where a positive voltage lower than the avalanche voltage of the Zener diode is applied between pad PAD and ground GND. No current flows between pad PAD and ground GND through protection structure 10. The operating point of protection structure 10 is located on portion F1 of the current-vs.-voltage characteristic.

Figure 8A:
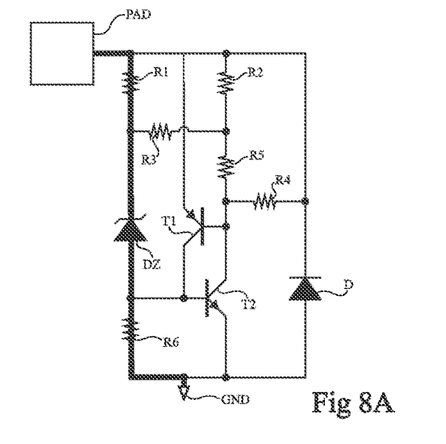
Figure 8B:
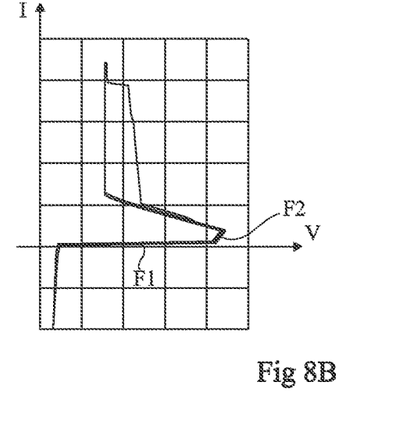

FIGS. 8A and 8B illustrate the case where a positive voltage greater than the avalanche voltage of the Zener diode is applied between pad PAD and ground GND with a low current. The current flows from pad PAD to ground successively through resistor R1 (and possibly also resistors R2, R3, R4, and R5), Zener diodes DZ, and resistor R6. The voltage across Zener diodes DZ is substantially constant, for example, approximately 5.5 V. The operating point of protection structure 10 is located on portion F2 of the current-vs.-voltage characteristic.

When the current increases from the previous case, the voltage across resistor R1 increases and the voltage across resistor R6 increases. At a first current level In, the emitter-base potential difference of NPN transistor T2 reaches the threshold voltage, for example 0.6 V, of transistor T2, which turns on. At a first current level Ip, the emitter-base potential difference of PNP transistor T1 reaches the threshold voltage, for example 0.6 V, of transistor T1, which turns on. According to the values of resistors R1 and R6, current In may be smaller than current Ip, greater than current Ip, or substantially equal to current Ip.

Figure 9A:
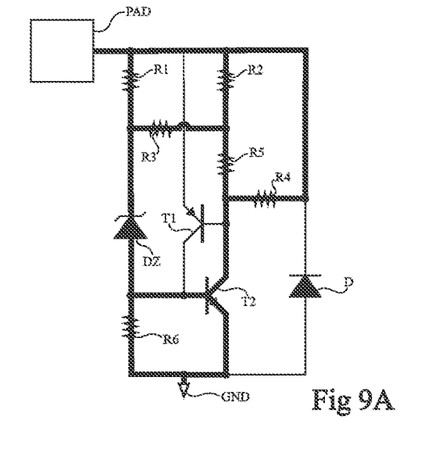
Figure 9B:
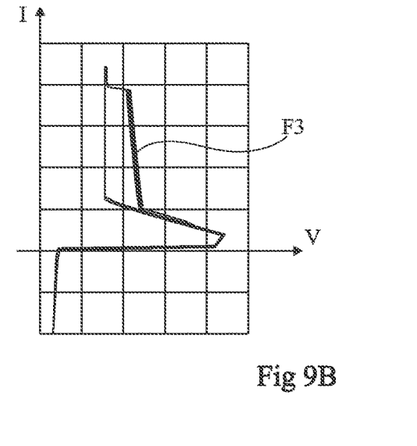

FIGS. 9A and 9B illustrate the case where a positive voltage greater than the avalanche voltage of the Zener diode is applied between pad PAD and ground GND, in the case where current In is smaller than Ip, and in the case where the current supplied by pad PAD becomes greater than In. NPN transistor T2 turns on. The operating point of protection structure 10 is located on portion F3 of the current-vs.-voltage characteristic.

Figure 10A:
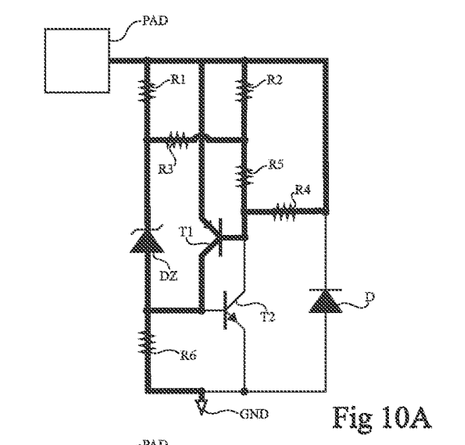
Figure 10B:
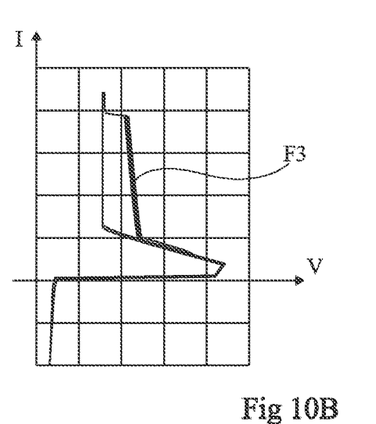

FIGS. 10A and 10B illustrate the case where a positive voltage greater than the avalanche voltage of the Zener diode is applied between pad PAD and ground GND, in the case where current Ip is smaller than In, and in the case where the current supplied by pad PAD becomes greater than Ip. PNP transistor T1 turns on. The operating point of protection structure 10 is located on portion F3 of the current-vs.-voltage characteristic.

Figure 11A:
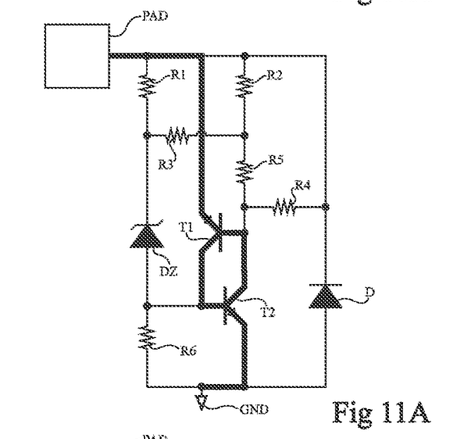
Figure 11B:
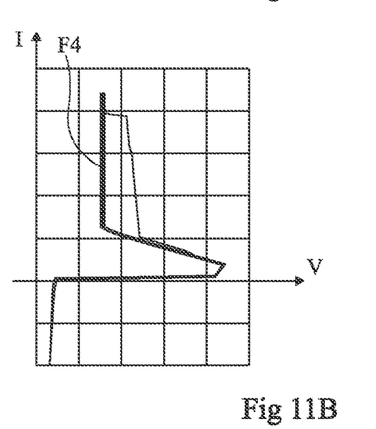

FIGS. 11A and 11B illustrate the case where a positive voltage greater than the avalanche voltage of the Zener diode is applied between pad PAD and ground GND and in the case where the current supplied by pad PAD becomes greater than In and than Ip. Transistors T1 and T2 are then on. The operating point of protection structure 10 is located on portion F4 of the current-vs.-voltage characteristic.

The level at which portion F3 and portion F4 join in the upper portion of the current-vs.-voltage characteristic is determined, in particular, by currents In and Ip. The more portion F3 extends along the axis of ordinates, the higher the intensity of the current necessary to turn on thyristor Thy. This may be advantageous to avoid an unwanted turning on of thyristor Thy during the normal operation of the integrated circuit.

Figure 12A:
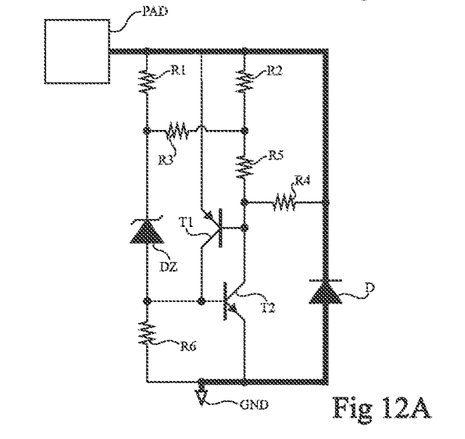
Figure 12B:
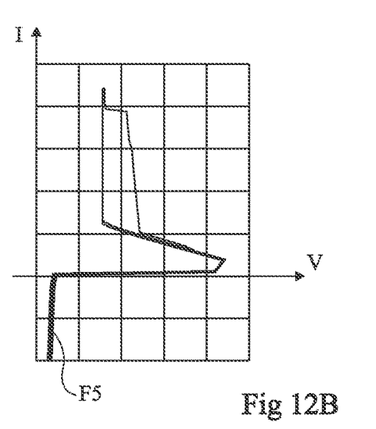

FIGS. 12A and 12B illustrate the case where a negative voltage is applied between pad PAD and ground GND. Diode D is forward biased and conducts the current between ground GND and pad PAD. The operating point of protection structure 10 is located on portion F5 of the current-vs.-voltage characteristic.

Specific embodiments have been described. Various alterations, modifications, and improvements will occur to those skilled in the art. In particular, although an embodiment has been described for an integrated circuit formed in a P-type doped semiconductor substrate, it should be clear that the present invention may be implemented with an N-type doped substrate by inverting the doping types of the previously-described regions.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A semiconductor device comprising:
   an input-output pad;
   a terminal adapted to be connected to a source of a reference potential;
   a thyristor that is forward-connected between the pad and the terminal, the thyristor comprising a PNPN structure, an anode, a cathode gate and a first resistor between the cathode gate and the terminal;
   a Zener diode coupled between the thyristor and the pad, the Zener diode having an anode coupled to the cathode gate of the thyristor and a cathode coupled to the pad via a second resistor, the Zener diode having a junction that is different from junctions of the PNPN structure of the thyristor; and
   a third resistor between the anode of the thyristor and the pad.

2. A semiconductor device comprising:
   an input-output pad;
   a terminal adapted to be connected to a source of a reference potential;
   a thyristor that is forward-connected between the pad and the terminal, the thyristor comprising a PNPN structure, an anode, a cathode gate and a first resistor between the cathode gate and the terminal;
   a Zener diode coupled between the thyristor and the pad, the Zener diode having an anode coupled to the cathode gate of the thyristor and a cathode coupled to the pad via a second resistor, the Zener diode having a junction that is different from junctions of the PNPN structure of the thyristor; and
   a diode having an anode coupled to the terminal and a cathode coupled to the pad.

3. The semiconductor device of claim 1, further comprising integrated circuitry coupled to the input-output pad, the thyristor and Zener diode coupled to protect the integrated circuitry from electrostatic discharge.

4. A semiconductor device, comprising:
   a doped substrate of a first conductivity type and having a surface;

a first doped semiconductor region of a second conductivity type opposite to the first conductivity type and extending in the substrate from the surface, the first region comprising a first portion extending along a first direction and continued at each end by a second portion extending along a second direction perpendicular to the first direction;

an input-output pad at the surface of the substrate;

a terminal at the surface of the substrate and adapted to be connected to a source of a reference potential;

a thyristor that is forward-connected between the pad and the terminal, the thyristor comprising an anode, a cathode gate and a first resistor between the cathode gate and the terminal, the thyristor formed as a PNPN structure including a first transistor and a second transistor, the first portion of the first region forming a base of the first transistor, wherein the semiconductor device comprises a second doped semiconductor region of the first conductivity type, more heavily doped than the substrate, extending in the first portion of the first region only down to part of s depth of the first portion of the first region, the second region forming an emitter of the first transistor; and a Zener diode coupled between the thyristor and the pad, the Zener diode having an anode coupled to the cathode gate of the thyristor and a cathode coupled connected to the pad via a second resistor, the Zener diode having a junction that is different from junctions of the PNPN structure of the thyristor.

5. The semiconductor device of claim 4, comprising a controller coupled to turn on the first transistor before, after, or at the same time as the second transistor.

6. The semiconductor device of claim 4, wherein, in each second portion of the first region, a third doped semiconductor region of the first conductivity type, more heavily doped than the substrate, extending in the second portion of the first region only down to part of s depth of the second portion of the first region, the third region forming the anode of the Zener diode.

7. The semiconductor device of claim 6, wherein, in each second portion of the first region, a fourth doped semiconductor region of the second conductivity type, extends from the surface, crosses the third semiconductor region and comes into contact with the second portion of the first region, the fourth region forming the cathode of the Zener diode.

8. A semiconductor device, comprising:

a doped substrate of a first conductivity type and having a surface;

a first doped semiconductor region of a second conductivity type opposite to the first conductivity type and extending in the substrate from the surface, the first region comprising a first portion extending along a first direction and continued at each end by a second portion extending along a second direction perpendicular to the first direction;

an input-output pad at the surface of the substrate;

a terminal at the surface of the substrate and adapted to be connected to a source of a reference potential;

a thyristor that is forward-connected between the pad and the terminal, the thyristor comprising an anode, a cathode gate and a first resistor between the cathode gate and the terminal, the thyristor formed as a PNPN structure including a first transistor and a second transistor, the first portion of the first region forming a base of the first transistor;

a Zener diode coupled between the thyristor and the pad, the Zener diode having an anode coupled to the cathode gate of the thyristor and a cathode coupled connected to the pad via a second resistor, the Zener diode having a junction that is different from junctions of the PNPN structure of the thyristor; and a fifth doped semiconductor region of the second conductivity type, the fifth region being located in depth in the substrate, the first region partially covering the fifth region and being in contact with the fifth region.

9. The semiconductor device of claim 8, wherein the fifth region delimits a first area of the substrate covering the fifth region and forming a base of the second transistor.

10. The semiconductor device of claim 8, wherein the fifth region forms an electric resistor connected to the cathode of the Zener diode.

11. The semiconductor device of claim 8, wherein the fifth region forms a shunt connected to a base of the first transistor.

12. The semiconductor device of claim 8, further comprising a diode having an anode coupled to the terminal and a cathode coupled to the pad, wherein the fifth region at least partly forms the cathode or the anode of the diode.

13. The semiconductor device of claim 8, further comprising a diode having an anode coupled to the terminal and a cathode coupled to the pad, wherein the semiconductor device comprises two sixth doped semiconductor regions of the second conductivity type, extending in the substrate from the surface and coming into contact with the fifth region, the two sixth regions being located on either side of the first portion of the first region, each sixth region being separated from the second portions of the first region by a second area of the substrate, the sixth regions forming the cathode of the diode.

14. The semiconductor device of claim 13, wherein the second areas of the substrate form a shunt connected to a base of the second transistor.

15. The semiconductor device of claim 13, wherein the semiconductor device comprises two seventh doped semiconductor regions of the second conductivity type, extending in the substrate from the surface and which do not come into contact with the fifth region nor into contact with the second portions of the first region, the two seventh regions being located on either side of the first portion of the first region, each seventh region being interposed between the first portion of the first region and one of the sixth regions, the seventh regions forming an emitter of the second transistor.

16. A semiconductor device comprising:

a semiconductor substrate lightly doped with a first conductivity type dopant and having a surface;

a first doped region of the first conductivity type, more heavily-doped than the substrate, extending in the substrate from the surface and forming in top view a ring delimiting a portion of surface;

a second doped region of a second conductivity type opposite the first conductivity type, the second doped region extending in the substrate from the surface and surrounded by the first doped region, the second doped region comprising a central portion having a major axis parallel to a first direction and first and second lateral portions located at first and second ends of the central portion, each lateral portion having a major axis parallel to a second direction that is perpendicular to the first direction;

a third doped region of the second conductivity type spaced from the surface of the substrate and in contact with a bottom portion of the second doped region, the third doped region having a major access parallel to the first direction;

a fourth doped region of the first conductivity type, more heavily doped than the substrate, extending from the surface in the substrate and surrounded by the first doped region, the fourth doped region having a major axis substantially parallel to the first direction;

a fifth doped region and a sixth doped region, each of the second conductivity type and more heavily doped than the second doped region, the fifth doped region and the sixth doped region located within the second doped region and each having a major axis substantially parallel to the second direction, the fifth doped region near a first portion of the first doped region and the sixth doped region near a second portion of the first doped region, the first portion spaced from the second portion by the second doped region;

a seventh doped region and an eighth doped region, each of the first conductivity type and having a major axis substantially parallel to the second direction, the seventh doped region spaced from the first portion of the first doped region by the fifth doped region and the eighth doped region spaced from the second portion of the first doped region by the sixth doped region;

a plurality of ninth doped regions of the second conductivity type, each ninth doped region extending from the surface of the substrate through the seventh doped region within the first lateral portion of the second doped region; and a plurality of tenth doped regions of the second conductivity type, each tenth doped region extending from the surface of the substrate through the eighth doped region within the second lateral portion of the second doped region.

17. The semiconductor device of claim 16, further comprising:

an eleventh doped region of the second conductivity type spaced from the fourth doped region and having a major axis substantially parallel to the first direction;

a twelfth doped region of the second conductivity type spaced from the fourth doped region and having a major axis substantially parallel to the first direction, the twelfth doped region spaced from the eleventh doped region by the fourth doped region;

a thirteenth doped region of the second conductivity type extending parallel to the eleventh doped region between the first doped region and the eleventh doped region, the thirteenth doped region extending from the surface of the substrate to the third doped region; and a fourteenth doped region of the second conductivity type extending parallel to the twelfth doped region between the first doped region and the twelfth doped region, the thirteenth doped region extending from the surface of the substrate to the third doped region.

18. The semiconductor device of claim 17, wherein:

a portion of the substrate extending down from the surface between the eleventh doped region and the third doped region is doped with the first conductivity type;

a portion of the substrate extending down from the surface between the fourth doped region and the third doped region is doped with the second conductivity type; and a portion of the substrate extending down from the surface between the twelfth doped region and the third doped region is doped with the first conductivity type.

19. The semiconductor device of claim 18, further comprising:

a fifteenth doped region of the first conductivity type extending parallel to the twelfth doped region between the first doped region and the twelfth doped region;

a sixteenth doped region of the first conductivity type extending parallel to the eleventh doped region between the first doped region and the eleventh doped region;

a seventeenth doped region of the second conductivity type formed within the thirteenth doped region and more heavily doped than the thirteenth doped region; and an eighteenth doped region of the second conductivity type formed within the fourteenth doped region and more heavily doped than the fourteenth doped region.

20. The semiconductor device of claim 2, further comprising integrated circuitry coupled to the input-output pad, the thyristor and Zener diode coupled to protect the integrated circuitry from electrostatic discharge.

21. The semiconductor device of claim 8, comprising a controller coupled to turn on the first transistor before, after, or at the same time as the second transistor.

* * * * *